United States Patent [19]

Herold

[11] Patent Number: 5,113,092
[45] Date of Patent: May 12, 1992

[54] DIFFERENTIAL VOLTAGE COMPARATOR

[75] Inventor: Barry W. Herold, Boca Raton, Fla.

[73] Assignee: Motorola, Inc., Schaumburg, Ill.

[21] Appl. No.: 576,041

[22] Filed: Aug. 31, 1990

[51] Int. Cl.$^5$ ............................................. H03K 5/153
[52] U.S. Cl. ................................... 307/356; 330/253
[58] Field of Search ................. 307/355, 356; 330/253

[56] References Cited

U.S. PATENT DOCUMENTS 3,961,279 6/1976 Davis ................................. 330/253

OTHER PUBLICATIONS

Carver Mead, Analog VLSI and Neural Systems, ©1989, Addison-Wesley Publishing Co., pp. 67-82, pp. 305-317, and pp. 319-338.
Prepared by the Engineering Staff of American Micro-systems, Inc., MOS Integrated Circuits, ©1972, Published by Van Nostrand Reinhold Co., pp. 90-93, pp. 162-169, and pp. 215-220.

*Primary Examiner*—James B. Mullins
*Attorney, Agent, or Firm*—Daniel R. Collopy; Vincent B. Ingrassia; William E. Koch

[57] ABSTRACT

A differential voltage comparator circuit comprises a differential pair (802 and 804) electrically coupled to a biasing network (806) and a loading network (808). The differential pair circuit comprises a first (802) and a second (804) controllable electron valves arranged in a differential pair configuration. The first and second electron valve drains (811 and 810) are electrically coupled to the loading network (808). The first and second electron valve sources (822 and 824) are electrically coupled to the biasing network (806). The first and second electron valve control gates (834 and 836) are electrically coupled to respective first and second input voltage potentials (V1 and V2). Lastly, the first and second electron valve bodies (812 and 814) are electrically coupled to respective first and second body effect voltage potentials (VB1 and VB2) that are not the same voltage potential. A voltage compare output (832) is electrically coupled to the second electron valve drain (810) for presenting an electrical signal (Iout) representative of the compared differential input voltage potentials (V1 and V2).

25 Claims, 3 Drawing Sheets

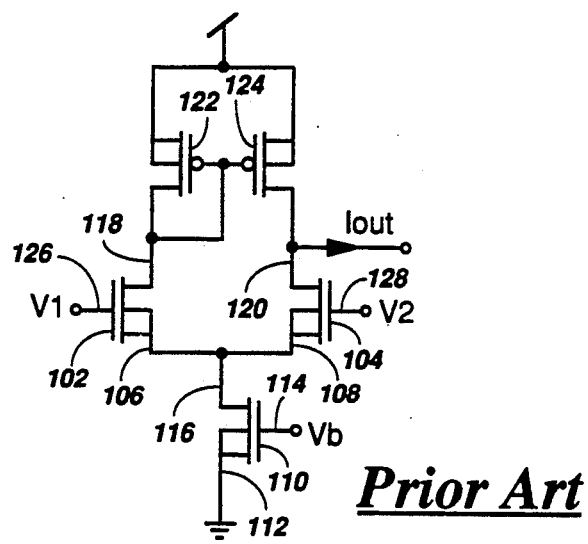
FIG. 1 *Prior Art*
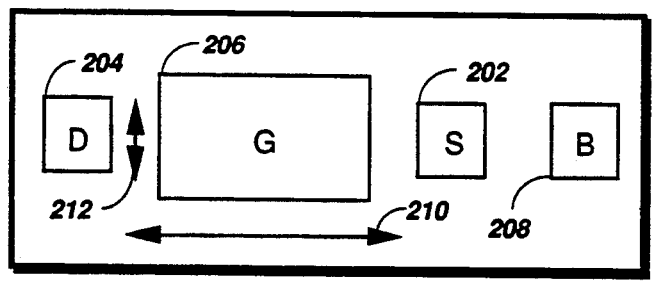
FIG. 2
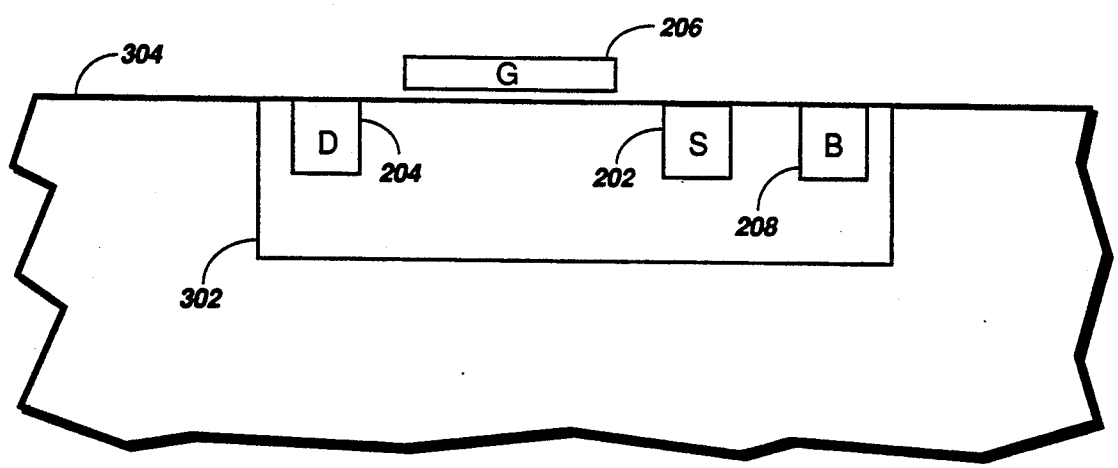
FIG. 3

005,113,092

DIFFERENTIAL VOLTAGE COMPARATOR

FIELD OF THE INVENTION

This invention relates in general to the field of electrical circuits comprising differential voltage comparators, and more specifically to those differential voltage comparators capable of electrically coupling the bodies of a differential pair to respective body effect voltage potentials.

BACKGROUND OF THE INVENTION

Many portable communication devices (e.g., selective call receivers), require operation from very low power sources (e.g. a AA battery). A sensor within the device may be used to indicate when the incoming voltage potential is above a desired operating threshold. Below the operating threshold the device's circuits typically are maintained in a known standby state.

Conventional sensors may comprise a differential voltage comparator circuit, such as shown in FIG. 1. The differential voltage comparator of FIG. 1 comprises a differential pair of N-channel metaloxide semiconductor (MOS) transistors (102 and 104), having their sources (106 and 108) electrically coupled together. Additionally, a bias network comprises an N-channel MOS transistor 110 with its source 112 tied to ground. A bias voltage (Vb) applied to a gate 114 of the transistor 110 regulates a bias current at the summing point (sources (106 and 108)) of the differential pair and a drain 116 of the biasing transistor 110.

The differential pair (102 and 104) are also electrically coupled at their respective drains (118 and 120) to a loading network that comprises two P-channel MOS transistors (122 and 124) in a conventional "current mirror" configuration. As is known, the loading network regulates a load current supplied to the differential pair (102 and 104).

Two respective input voltage potentials (V1 and V2) may be presented at the gates (126 and 128) of the differential pair (102 and 104). An output current (Iout) taken typically at a drain 120 of one of the differential pair (102 and 104) represents the compared differential input voltage potentials (V1 and V2). To determine the threshold criteria one of the input voltages (e.g., V2), may be set to a predetermined reference voltage potential. Therefore, when the other differential input voltage potential (e.g., V1), crosses the predetermined reference threshold the output signal (Iout) indicates a changed condition.

Regrettably, conventional device arrangements such as shown in FIG. 1 may exceed the desired current specifications for very low power sensor applications, as required in many portable communication devices (e.g., selective call receivers). Accordingly, a need exists for a low power voltage sensor.

SUMMARY OF THE INVENTION

In carrying out one form of this invention, there is provided a differential voltage comparator circuit comprising a differential pair circuit. A biasing network regulates a bias current and a loading network regulates a load current, the networks being electrically coupled to the differential pair circuit. The differential pair circuit is configured to provide an output electrical signal that is representative of two differentially compared input voltage potentials.

A first differential input is capable of receiving a first input voltage potential and electrically coupling the first input voltage potential to a first controllable electron valve. The first controllable electron valve is constructed and arranged to have a first electron valve body that is electrically coupled to a first body effect voltage potential, a first electron valve source that is electrically coupled to the biasing network, a first electron valve drain that is electrically coupled to the loading network, and a first electron valve control gate that is electrically coupled to the first differential input.

A second differential input is capable of receiving a second input voltage potential and electrically coupling the second input voltage potential to a second controllable electron valve. The second controllable electron valve is constructed and arranged to have a second electron valve body that is electrically coupled to a second body effect voltage potential that is not equal to the first body effect voltage potential, a second electron valve source that is electrically coupled to the biasing network, a second electron valve drain that is electrically coupled to the loading network, and a second electron valve control gate that is electrically coupled to the second differential input.

A voltage compare output is electrically coupled to the first electron valve drain for presenting an electrical signal representative of the compared differential input voltage potentials.

BRIEF DESCRIPTION OF THE DRAWINGS

FIG. 1 is a circuit topology of a conventional differential pair voltage comparator.

FIG. 2 is a top view of a metal-oxide semiconductor (MOS) transistor.

FIG. 3 is a side view of the MOS transistor of FIG. 2.

DESCRIPTION OF A PREFERRED EMBODIMENT

Figure 4:
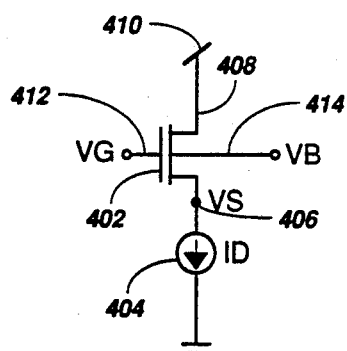
FIG. 4 is a circuit topology of an N-channel MOS transistor and a constant current source.

Referring to FIG. 2, a top view of a MOS transistor illustrates one possible construction and arrangement of the MOS device. A controllable electron valve (e.g., the MOS transistor), may comprise an electron valve source 202, an electron valve drain 204, an electron valve control gate 206, and an electron valve body contact 208. As is known, a channel may be constructed between the source 202 and the drain 204 having a channel length (L) 210 and a channel width (W) 212 dimensions that are substantially controllable by the manufacturing process. These channel dimensions directly affect the current carrying capability of the device.

Referring to FIG. 3, a side view of the MOS transistor of FIG. 2 is shown. The construction of the device may comprise an N-channel process, where the drain 204 and the source 202 areas are normally doped via conventional techniques with N type material and an island (i.e., a body) 302, is typically doped with P type material. Alternately, the construction of the device may comprise a P-channel process, where the doping of the drain 204, the body 302, and the source 202 are respectively P-N-P. In this fashion, the MOS device may be typically grown starting with a semiconductor (e.g., silicon), substrate 304.

The semiconductor substrate 304 under normal operating conditions is at a neutral voltage potential (e.g., ground). The body 302 of the device, which is substantially insulated from the substrate 304, normally has the body contact area 208 that is heavily doped with the same type of material as the rest of the body 302. Therefore, an N-P-N device may have a body contact 208 heavily doped with P type material and a P-N-P device with N type material. The contact 208 allows applying a voltage potential to the body 302. The voltage potential of the body 302 relative to the voltage potential of the source 202 of the device directly affects the characteristics of the channel and consequently the current carrying capability of the device.

Hence, it may be seen that the construction and arrangement of a differential pair is capable of manipulating the electrical current carrying capabilities of the respective controllable electron valves. Moreover, it will be shown that by selecting an optimal width (W) 212 to length (L) 210 ratio for the devices and by electrically coupling their bodies 208 to different body effect voltage potentials the comparison of an incoming voltage potential relative to an operating voltage threshold may be accomplished with very low power required for the differential sensing operation, as will be more fully discussed below.

Figure 5:
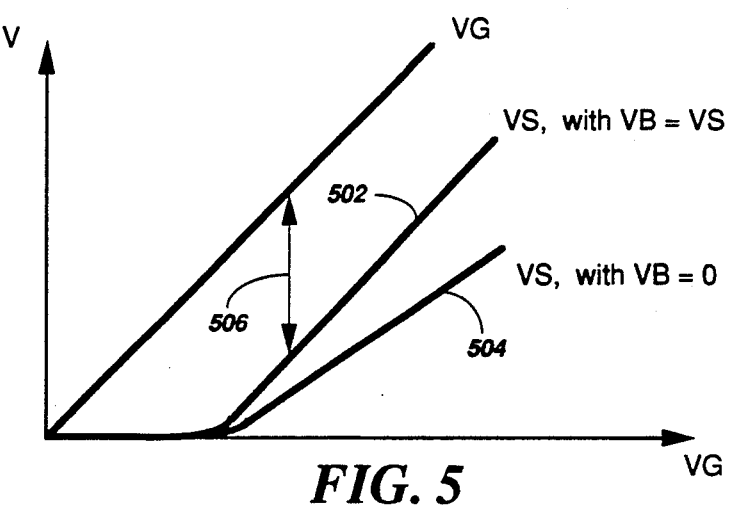
FIG. 5 is a plot showing the effect on a voltage potential measured at the source (VS) of the MOS transistor of FIG. 4 due to a change in the body voltage potential.

Referring to FIGS. 4 and 5, an exemplary circuit topology is shown comprising an N-channel MOS transistor 402 and a constant current source (ID) 404 electrically coupled to the source 406 of the MOS device 402 and to ground. The drain 408 of the device 402 is tied to a positive voltage potential 410.

The performance curves of FIG. 5 represent a relationship between a voltage potential (VG) applied at a control gate 412 of the device 402 and a voltage potential (VS) present at the source 406. Both VS curves (502 and 504) are shown within sub-threshold operation of the device 402, typically characterized by the difference in voltage potential between VG and VS 506. Above this threshold voltage potential (VT) the device 402 is considered in the normal operating region with a channel (not shown) for the device 402 optimally conducting current. However, below the threshold voltage potential (VT) the device 402 typically experiences difficulty in conducting current, although still capable of conducting current.

The two VS curves (502 and 504) are shown given a substantially constant drain current (ID). The increasing source voltage potential (VS) relative to the increasing gate voltage potential (VG) is reflective of the current carrying capability of the device 402, since the drain current (ID) is essentially maintained constant. Therefore, the two VS curves (502 and 504) represent the current carrying capability of the device 402 subject to two different voltage potentials (i.e., VB=VS or VB=0), being applied to the body 414 of the exemplary device 402. Moreover, two different body effect voltage potentials electrically coupled to the bodies of a differential pair affects their relative current carrying capabilities with respect to a changing control gate voltage (VG), in accordance with the current invention.

It may be seen that the current carrying capability of the device 402 may be enhanced by setting the body voltage potential (VB) to the source voltage potential (VS). This is the conventional approach of constructing and arranging such MOS devices (102, 104, 110, 122, and 124) (see FIG. 1). Therefore, the body 414 is normally electrically coupled to the source 406 of the device 402 in conventional device arrangements to enhance the current carrying capability of the device 402.

Regrettably, the enhanced current carrying capability of the conventional differential pair (102 and 104) (see FIG. 1) (i.e., accomplished by the electrical coupling of the body 414 to the source 406 for both MOS devices (102 and 104)), competes with the low power sensing requirement. Instead of increasing the current flowing in the conventional differential pair (102 and 104) to quickly bring the devices (102 and 104) into the normal operating range, the inventive low power sensor necessarily performs the sensing operation with minimal current drain and preferably in the sub-threshold (i.e., below VT), voltage range, as will be more fully discussed below. Moreover, in very low power applications, the conventional sensor's current drain may deplete valuable power that a communication device circuit (not shown) may require to build up the incoming voltage potential. Consequently, the conventional sensor may defeat an attempt to power-up the circuit.

Figure 6:
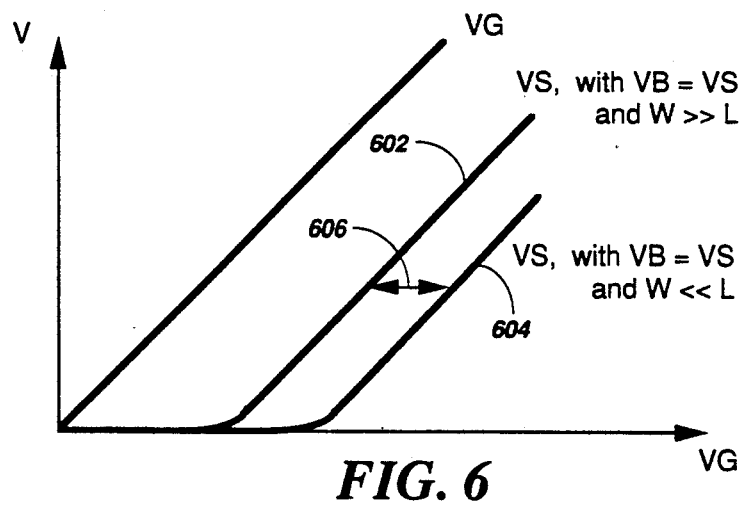
FIG. 6 is a plot showing the effect on a voltage potential measured at the source (VS) of the MOS transistor of FIG. 4 due to a change in the ratio of width to length dimensions of the channel of the MOS device.

Referring to FIG. 6, two VS curves (602 and 604) represent two possible constructions of channel dimensions (not shown) for an exemplary MOS device 402 of FIG. 4. In both cases, a body 414 is electrically coupled to a source 406. Therefore, the body effect voltage potential (VB) is maintained essentially constant for comparison of the curves (602 and 604).

A change in the ratio of channel width (W) 212 to channel length (L) 210 (see FIGS. 2 and 3), which is substantially controllable by a manufacturing process, tends to shift 606 the VS curve 604. Therefore, a control gate voltage potential (VG) may be greater in one curve 604 over the other curve 602 for a substantially equivalent current carrying capability (i.e., for the same VS value). Hence, these channel dimensions directly affect the current carrying capability of a device 402, as shown 606. Moreover, the width (W) 212 to length (L) 210 ratios of a differential pair may be selected to affect their relative current carrying capabilities with respect to a changing control gate voltage (VG), in accordance with the current invention.

Figure 7:
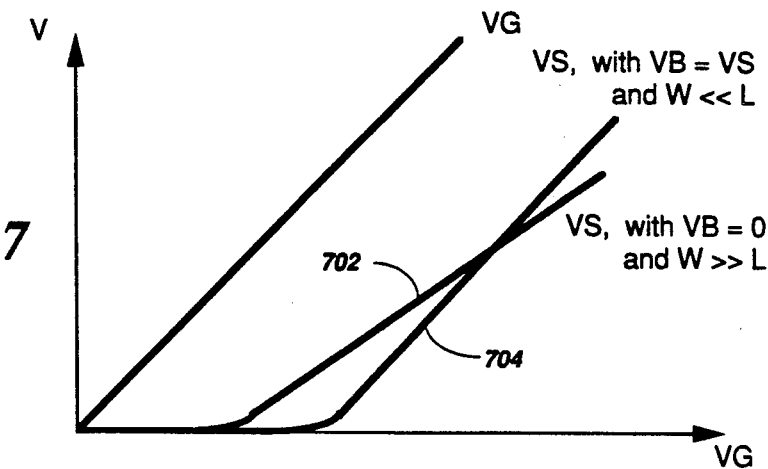
FIG. 7 is a plot illustrating two curves for two MOS devices, similar to FIGS. 4, 5, and 6, such that the selection of a cross-over point in their curves is suitable for use in a very low-power differential pair configuration.

Referring to FIG. 7, two VS curves (702 and 704) are shown representing an overlay of the construction and arrangement conditions discussed for FIGS. 5 and 6. The selection of a cross-over point in the two curves (702 and 704) may be accomplished by construction of the channel width (W) 212 much greater than the channel length (L) 210 (e.g., approximately 400 microns to 4 microns), and electrically coupling the body 414 to a ground voltage potential for the device 402 in one case 702, and by setting the channel width (W) 212 much smaller than the channel length (L) 210 (e.g., 5 microns to 200 microns), and electrically coupling the body 414 to the source 406 for the device 402 in the other case 704. In this fashion, an inventive construction and arrangement of a very low power differential pair configuration is possible. By selecting a sub-threshold (i.e., below VT), cross-over point for two devices that are arranged in a differential pair configuration, the inventive voltage comparator sensor may be constructed and arranged to operate with minimal current drain, as is more fully discussed below.

Figure 8:
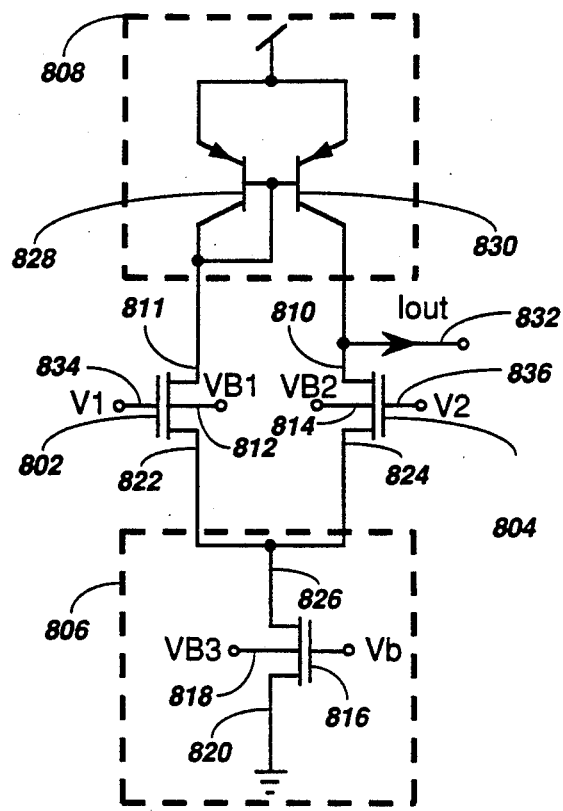
FIG. 8 is a differential voltage comparator circuit topology.

Referring to FIG. 8, a differential voltage comparator circuit is shown comprising two controllable electron valves (802 and 804) in a differential pair configuration, a biasing network 806, and a loading network 808. An electrical signal (Iout), that may be taken at a drain 810 of one of the devices 804 represents the compared differential input voltage potentials (V1 and V2). In this exemplary circuit configuration the differential pair controllable electron valves (802 and 804) are N-channel MOS devices with their bodies (812 and 814) electrically coupled to respective body effect voltage potentials VB1 and VB2. The two body effect voltage potentials (VB1 and VB2) are preferably different values.

In similar fashion, the biasing network 806 comprises a controllable electron valve 816 with exemplary construction using N-channel MOS processing. A body 818 is electrically coupled to a body effect voltage potential VB3 that is not necessarily the same as the voltage potential at a source 820 for the device 816. A bias voltage Vb may serve to regulate a bias current at the summing point (sources (822 and 824)) of the differential pair and a drain 826 of the biasing transistor 816.

The loading network 808, in this example, comprises bipolar transistors (828 and 830) in a "current mirror" configuration. The bipolar devices (828 and 830) may provide the advantage of lower voltage operation that is required for a very low power voltage comparator circuit. Therefore, the voltage comparator of FIG. 8 comprises Bi-MOS technology.

Figure 9:
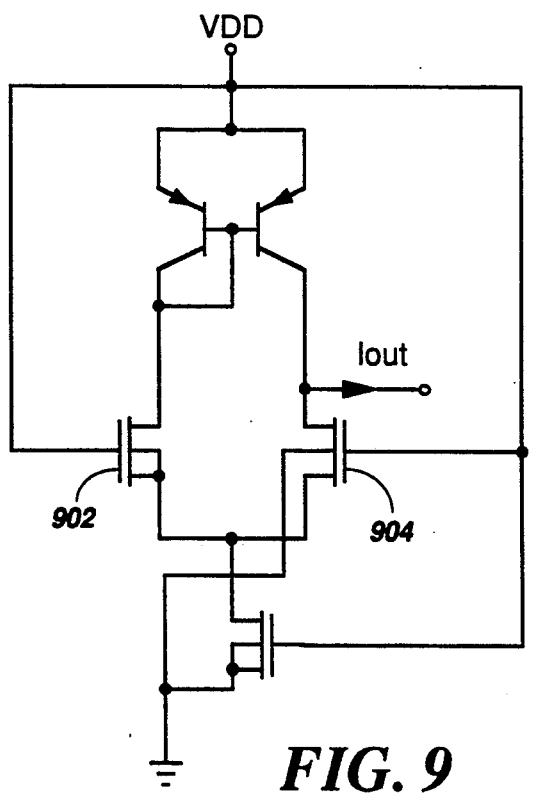
FIG. 9 is a differential voltage comparator circuit topology in accordance with an embodiment of the present invention.

Referring to FIG. 9, a differential voltage comparator circuit topology is shown, in accordance with an embodiment of the present invention. This very low power sensor may signal (i.e., with Iout taken at the drain of either transistor of the differential pair 902 or 904), when an incoming voltage potential (VDD) crosses a predetermined voltage threshold. By implementing the inventive differential pair configuration (902 and 904), having the bodies electrically coupled to different body effect voltage potentials such as one transistor body being coupled to its respective transistor source and the other transistor body being coupled to ground, and constructing the width (W) and length (L) ratios as discussed earlier, this sensor is able to detect when the incoming voltage (VDD) exceeds an operating threshold, requiring approximately 0.5 micro-amps of current for the sensing operation.

What is claimed is:

1. A voltage comparator circuit, comprising:
   a biasing network for regulating a bias current;
   a loading network for regulating a load current;
   a first differential input for receiving a first input voltage potential;
   a first controllable electron valve constructed and arranged to have a first electron valve body that is electrically coupled to a first body effect voltage potential, the first controllable electron valve further comprising:
      a first electron valve source that is electrically coupled to the biasing network;
      a first electron valve drain that is electrically coupled to the loading network; and
      a first electron valve control gate that is electrically coupled to the first differential input;
   a second differential input for receiving a second input voltage potential;
   a second controllable electron valve constructed and arranged to have a second electron valve body that is electrically coupled to a second body effect voltage potential that is different than the first body effect voltage potential, the second controllable electron valve further comprising:
      a second electron valve source that is electrically coupled to the biasing network;
      a second electron valve drain that is electrically coupled to the loading network; and
      a second electron valve control gate that is electrically coupled to the second differential input; and
   a voltage compare output, electrically coupled to the first electron valve drain, for presenting an electrical signal representative of the compared differential input voltage potentials.

2. The circuit of claim 1, wherein the first electron valve body is electrically coupled to the first electron valve source.

3. The circuit of claim 1, wherein the second electron valve body is electrically coupled to the second electron valve source.

4. The circuit of claim 1, wherein the controllable electron valves comprise at least one N-channel MOS transistor.

5. The circuit of claim 1, wherein the controllable electron valves comprise at least one P-channel MOS transistor.

6. The circuit of claim 1, wherein the loading network comprises at least two controllable electron valves in a current mirror configuration, thereby providing an active load for the first and second electron valves that are in a differential pair configuration.

7. The circuit of claim 1, wherein the biasing network comprises at least one biasing controllable electron valve having its electron valve drain electrically coupled to the first and the second electron valve sources that are in a differential pair configuration, thereby providing a biasing current for the differential pair, the biasing electron valve further comprising:
   an electron valve source that is electrically coupled to a reference voltage potential;
   an electron valve control gate that is electrically coupled to a biasing voltage potential; and
   an electron valve body that is electrically coupled to a third body effect voltage potential.

8. The circuit of claim 7, wherein the biasing electron valve body is electrically coupled to the biasing electron valve source.

9. A voltage comparator circuit, comprising:
   a biasing network for regulating a bias current;
   a loading network for regulating a load current;
   a first differential input for receiving a first input voltage potential;
   a first controllable electron valve constructed and arranged to have a first electron valve body that is electrically coupled to a first body effect voltage potential, the first controllable electron valve further comprising:
      a first electron valve source that is electrically coupled to the biasing network;

a first electron valve drain that is electrically coupled to the loading network; and a first electron valve control gate that is electrically coupled to the first differential input;

a second differential input for receiving a second input voltage potential;

a second controllable electron valve constructed and arranged to have a second electron valve body that is electrically coupled to a second body effect voltage potential that is different than the first body effect voltage potential, the second controllable electron valve further comprising:

a second electron valve source that is electrically coupled to the biasing network;

a second electron valve drain that is electrically coupled to the loading network; and a second electron valve control gate that is electrically coupled to the second differential input; and a voltage compare output, electrically coupled to the second electron valve drain, for presenting an electrical signal representative of the compared differential input voltage potentials.

10. The circuit of claim 9, wherein the first electron valve body is electrically coupled to the first electron valve source.

11. The circuit of claim 9, wherein the second electron valve body is electrically coupled to the second electron valve source.

12. The circuit of claim 9, wherein the controllable electron valves comprise at least one N-channel MOS transistor.

13. The circuit of claim 9, wherein the controllable electron valves comprise at least one P-channel MOS transistor.

14. The circuit of claim 9, wherein the loading network comprises at least two controllable electron valves in a current mirror configuration, thereby providing an active load for the first and second electron valves that are in a differential pair configuration.

15. The circuit of claim 9, wherein the biasing network comprises at least one biasing controllable electron valve having its electron valve drain electrically coupled to the first and the second electron valve sources that are in a differential pair configuration, thereby providing a biasing current for the differential pair, the biasing electron valve further comprising:

an electron valve source that is electrically coupled to a reference voltage potential;

an electron valve control gate that is electrically coupled to a biasing voltage potential; and an electron valve body that is electrically coupled to a third body effect voltage potential.

16. The circuit of claim 15, wherein the biasing electron valve body is electrically coupled to the biasing electron valve source.

17. A method for comparing a first and a second differential input voltage potentials that are respectively coupled to a first and a second controllable electron valves in a differential pair configuration, where each electron valve comprises an electron valve drain, an electron valve source, an electron valve control gate, and an electron valve body constructed and arranged such that the first and second electron valve drains are electrically coupled to a loading network and the first and second electron valve sources are electrically coupled to a biasing network, the method comprising the steps of:

(a) sensing the first input voltage potential at the first electron valve gate;

(b) sensing a first body effect voltage potential at the first electron valve body, the sensing being substantially contemporaneous with step (a);

(c) sensing the second input voltage potential at the second electron valve gate;

(d) sensing a second body effect voltage potential that is different from the first body effect voltage potential at the second electron valve body, the sensing being substantially contemporaneous with step (c); and (e) presenting an electrical output signal that represents the differentially compared input voltage potentials.

18. A voltage comparator circuit, comprising:

a biasing network for providing a bias current;

a loading network for regulating a load current;

a differentially coupled transistor pair, each transistor of the differentially coupled transistor pair having a drain coupled to the loading network, a source coupled to the biasing network, a body coupled to a body effect voltage potential, and a gate, the differentially coupled transistor pair being arranged such that a first and second input signals are respectively received by the gates of the transistors, and each transistor body of the differentially coupled transistor pair being coupled to a different body effect voltage potential; and an output port coupled to one of the drains of the transistor pair.

19. The voltage comparator circuit of claim 18, wherein the body of one of the transistors of the differentially coupled transistor pair is coupled to a body effect voltage potential that is present at the source of the transistor and the body of the other transistor of the differentially coupled transistor pair is coupled to a different body effect voltage potential.

20. The circuit of claim 18, wherein the transistors comprise at least one N-channel MOS transistor.

21. The circuit of claim 18, wherein the transistors comprise at least one P-channel MOS transistor.

22. The circuit of claim 18, wherein the loading network comprises at least two transistors in a current mirror configuration, thereby providing an active load for the transistors that are in a differential pair configuration.

23. The circuit of claim 18, wherein the biasing network comprises at least one biasing transistor having its drain electrically coupled to the differentially coupled transistor pair sources, thereby providing a biasing current for the differential pair, the baising transistor further comprising a biasing transistor source that is electrically coupled to a reference voltage potential, a biasing transistor gate that is electrically coupled to a biasing voltage potential, and a biasing transistor body that is coupled to a body effect voltage potential.

24. The circuit of claim 23, wherein the transistor body is coupled to a body effect voltage potential that is present at the source of the transistor.

25. A voltage comparator circuit, comprising:

a biasing network for regulating a bias current;

a loading network for regulating a load current;

a first differential input for receiving a first input voltage potential;

a first controllable electron valve constructed and arranged to have a first electron valve body that is electrically coupled to a first body effect voltage potential, the first controllable electron valve further comprising:
- a first electron valve source that is electrically coupled to the biasing network;
- a first electron valve drain that is electrially coupled to the loading network; and
- a first electron valve control gate that is electrically coupled to the first differential input;

a second differential input for receiving a second input voltage potential;

a second controllable electron valve constructed and arranged to have a second electron valve body that is electrically coupled to a second electron valve source having a voltage potential that is different than the first body effect voltage potential, the second controllable electron valve further comprising:

the second electron valve source that is electrically coupled to the biasing network;

a second electron valve drain that is electrically coupled to the loading network; and a second electron valve control gate that is electrically coupled to the second differential input; and a voltage compare output, electrically coupled to the first electron valve drain, for presenting an electrical signal representative of the compared differential input voltage potentials.

* * * * *